United States Patent [19]
Ohtani et al.

[11] Patent Number: 4,935,981
[45] Date of Patent: Jun. 26, 1990

[54] CLEANING APPARATUS HAVING A CONTACT BUFFER APPARATUS

[75] Inventors: Masami Ohtani; Masami Nishida, both of Kyoto, Japan

[73] Assignee: Dainippon Screen Mfg. Co., Ltd., Japan

[21] Appl. No.: 294,196

[22] Filed: Jan. 6, 1989

[30] Foreign Application Priority Data
Jan. 8, 1988 [JP] Japan .................. 63-1579

[51] Int. Cl.$^5$ .......................................... H01L 21/304
[52] U.S. Cl. ................... 15/21 C; 15/21 R; 15/97 R; 51/131.3; 51/165.78
[58] Field of Search ............ 15/21 R, 21 C, 21 D, 15/21 E, 53 A, 97 R; 51/131.3, 165.78

[56] References Cited

U.S. PATENT DOCUMENTS

| | | | |
|---|---|---|---|
| 2,986,849 | 6/1961 | Clark | 15/21 R X |
| 4,196,486 | 4/1980 | Capra | 15/53 A |
| 4,476,601 | 10/1984 | Oka | 15/21 D |

FOREIGN PATENT DOCUMENTS

57-90941  6/1982  Japan .
0193029  11/1984  Japan ................... 15/21 R

*Primary Examiner*—Edward L. Roberts
*Attorney, Agent, or Firm*—Ostrolenk, Faber, Gerb & Soffen

[57] ABSTRACT

An improved swing type substrate cleaning apparatus comprises a substrate chuck for holding the substrate while rotating the same, a cleaning brush holding apparatus for holding a cleaning brush while rotating the same, a cleaning brush elevating apparatus for holding the cleaning brush holding apparatus in a manner enabling elevation and swing of the same, and a buffer apparatus for reducing the velocity at which the cleaning brush elevating apparatus lowers the cleaning brush holding apparatus when the cleaning brush is lowered to be in contact with the substrate. Since the velocity with which the cleaning brush is lowered is reduced to be lower than a prescribed value by means of the buffer apparatus, no significant shock is created when the cleaning brush is brought into contact with the substrate.

21 Claims, 5 Drawing Sheets

CLEANING APPARATUS HAVING A CONTACT BUFFER APPARATUS

BACKGROUND OF THE INVENTION

1. Field of the Invention

The present invention relates to a cleaning apparatus for cleaning semiconductor wafers, glass for photomasks and the like (hereinafter referred to as substrates) and, more specifically, to a cleaning apparatus provided with a contact buffer apparatus.

2. Description of Related Art

A cleaning apparatus of interest to the present invention is disclosed in, for example, Japanese Patent Laying-Open Gazette No. 90941/1982. FIG. 1 is a side view of the cleaning apparatus shown in the gazette. The cleaning apparatus shown therein is called a swing type cleaning apparatus, since an arm provided with a cleaning brush is swingable.

Referring to FIG. 1 of the prior disclosure, the conventional cleaning apparatus comprises a cleaning portion 121 for cleaning a substrate 141, and a supporting portion 122 for supporting the cleaning portion 121. The cleaning portion 121 comprises: a rotary cleaning brush 102 for cleaning the substrate 141; a swing arm 101 for supporting the rotary cleaning brush 102 swingable in a horizontal direction; a driving motor 103 for rotating the cleaning brush, which rotatably drives the cleaning brush 102; and a transmission belt 104 for transmitting the drive of the driving motor 103 to the rotary cleaning brush 102. The support portion 122 comprises: an arm support 105 for supporting the cleaning portion 121 enabling rotation and elevation of the cleaning portion 121; a rotary driving apparatus 111 for rotating the arm support 105; an elevating apparatus 117 for elevating the arm support 105; a rotating position detecting sensor 115 for detecting the rotating position of the cleaning brush 102; and a stop 107 for adjustably setting the position to which the swing arm 101 is lowered. The rotary driving apparatus 111, the elevating apparatus 117, the rotating position detecting sensor 115 and the stop 107 are mounted on a base 140 by means of brackets and the like. The rotary driving apparatus 111 comprises a rotary driving motor 112 for rotating the arm support 105 through the transmission belt 114, and the elevating apparatus 117 comprises an output rod 119 being in contact with a lower end portion of the arm support 105 for elevating/lowering the arm support 105. When the rotary cleaning brush 102 is located in the position illustrated in FIG. 1, a spin chuck 142 for holding the substrate 141 is provided therebelow. A rotating position detecting apparatus 115 comprises three rotating position detecting sensors 115A, 115B and 115C which detect that the rotary cleaning brush 102 is at a standby position A, a central position B of the substrate 141 and the peripheral position C of the substrate 141 shown in FIG. 1, respectively.

The operation of the swing type cleaning apparatus will be described in the following. When the substrate 141 is to be cleaned, first, the arm support 105 is raised by the elevating apparatus 115 at the standby position A shown in FIG. 1, so that the swing arm 101 is raised. Thereafter, the rotary driving motor 112 is rotated, the swing arm 101 is swung through the arm support 105, and the cleaning brush 102 is moved to a position above the central position B of the substrate 141. The cleaning brush 102 is rotated about its axis at the position B and the swing arm 101 is lowered under control of the stop 107 through the arm support 105. After the rotary cleaning brush 102 is brought into contact with the surface of the substrate 141, the rotary cleaning brush 102 is swung about the arm support 105 from the central position B to the peripheral position C of the substrate 141, so that the substrate 141 is cleaned by means of the rotary cleaning brush 102.

Usually, very fine circuit patterns are formed on the surface of the substrate 141 before or after the step of cleaning. Therefore, the substrate must be handled delicately in cleaning so as to prevent any minute damage on the surface of the substrate. As the degree of integration of the IC circuits has been increased, it has become necessary to more delicately treat the substrate to prevent any damage on the substrate, to remove dust more completely, etc.

In the above described conventional cleaning apparatus, when the cleaning brush 102 is brought into contact with the substrate 141, the brush is lowered at the operational velocity of the output rod 119 of the elevating apparatus 117. Consequently, the edge of the cleaning brush 102 strikes the surface of the substrate 141 with relatively large energy. Especially, when the brush has a smaller contact area, the shock at the time of contact becomes larger. Consequently, the surface of the substrate is damaged and the above described strict conditions of cleaning are not satisfied.

SUMMARY OF THE INVENTION

Therefore, one object of the present invention is to solve the above described problem and to provide a cleaning apparatus capable of improving yield in cleaning objects and satisfying more strict conditions of cleaning.

The above described objects of the present invention can be attained by a cleaning apparatus for cleaning an object by rotating a cleaner and an object to be cleaned provided opposed to each other with a cleaning liquid applied therebetween, comprising: an object holding apparatus for holding an object to be cleaned; a cleaner holding apparatus provided at a position which can be opposed to the object holding apparatus for holding the cleaner while rotating the same; a cleaner moving apparatus connected to the cleaner holding apparatus for moving the position of the cleaner to a first direction opposing to the object to be cleaned; and a buffer apparatus connected to the cleaner moving apparatus for controlling the cleaner such that the cleaner is brought into contact with the object to be cleaned with a force smaller than a prescribed force.

Since the cleaning apparatus in accordance with the present invention comprises the above described components, the force imposed on the object to be cleaned when the rotary cleaner is brought into contact with the object is smaller than a prescribed force. Therefore, a substrate cleaning apparatus can be provided which improves yield in cleaning objects and satisfies more strict conditions of cleaning.

According to a preferred embodiment of the present invention, the cleaner moving apparatus moves the cleaner in the first direction at a prescribed first velocity, and the buffer apparatus comprises decelerating means for decelerating the moving velocity of the cleaner moving apparatus from the first velocity to a second slower velocity.

Generally, the energy of a moving object is proportional to a product of a mass and the square of its relative velocity. Since the preferred embodiment of the present invention comprises the above described components, the velocity is reduced when the cleaner is brought into contact with the object, and therefore the relative energy of the cleaner and the object is also reduced. Consequently, a cleaning apparatus can be provided which prevents damage to the object.

According to a more preferred embodiment of the present invention, the buffer apparatus comprises second velocity changing means for changing the second velocity.

Since the second velocity is changeable, the contact energy when the cleaner is brought into contact with the object can be arbitrarily adjusted. Consequently, a cleaning apparatus can be provided which is capable of cleaning various objects in the most suitable manner corresponding to the different characteristics of each object.

According to a more preferred embodiment of the present invention, the cleaner moving apparatus comprises a detecting apparatus for detecting the fact that the cleaner is at a prescribed position in the first direction, and the rotation of the cleaner is controlled in response to the detected output therefrom, with the prescribed position being a position where the cleaner and the object are about to be in contact with each other.

According to a more preferred embodiment, the cleaning apparatus comprises the above described components. Therefore, the cleaner is not rotated until it is at the point of cleaning the object. Consequently, a cleaning apparatus requiring low running cost can be provided.

According to a more preferred embodiment of the present invention, the cleaner holding means comprises a longitudinal member having a cleaner mounting member for holding the cleaner formed on one end and a connecting portion to be connected with the cleaner moving apparatus formed on the other end.

The longitudinal member can be swung on a surface intersecting the first direction about the connecting portion connected with the cleaner moving apparatus.

The longitudinal member can be swung between a first position and a second position. The cleaner can be in contact with the object at the first position. The buffer apparatus comprises a cleaner movement stopping apparatus for stopping the movement of the cleaner lower than a prescribed position in the first direction, with the prescribed position in the first direction being adjustable.

Since the preferred embodiment of the present invention comprises the above described components, the degree of contact of the cleaner and the object can be arbitrarily selected. Consequently, a cleaning apparatus can be provided which is capable of cleaning various objects, each in a manner most suitable for that object.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
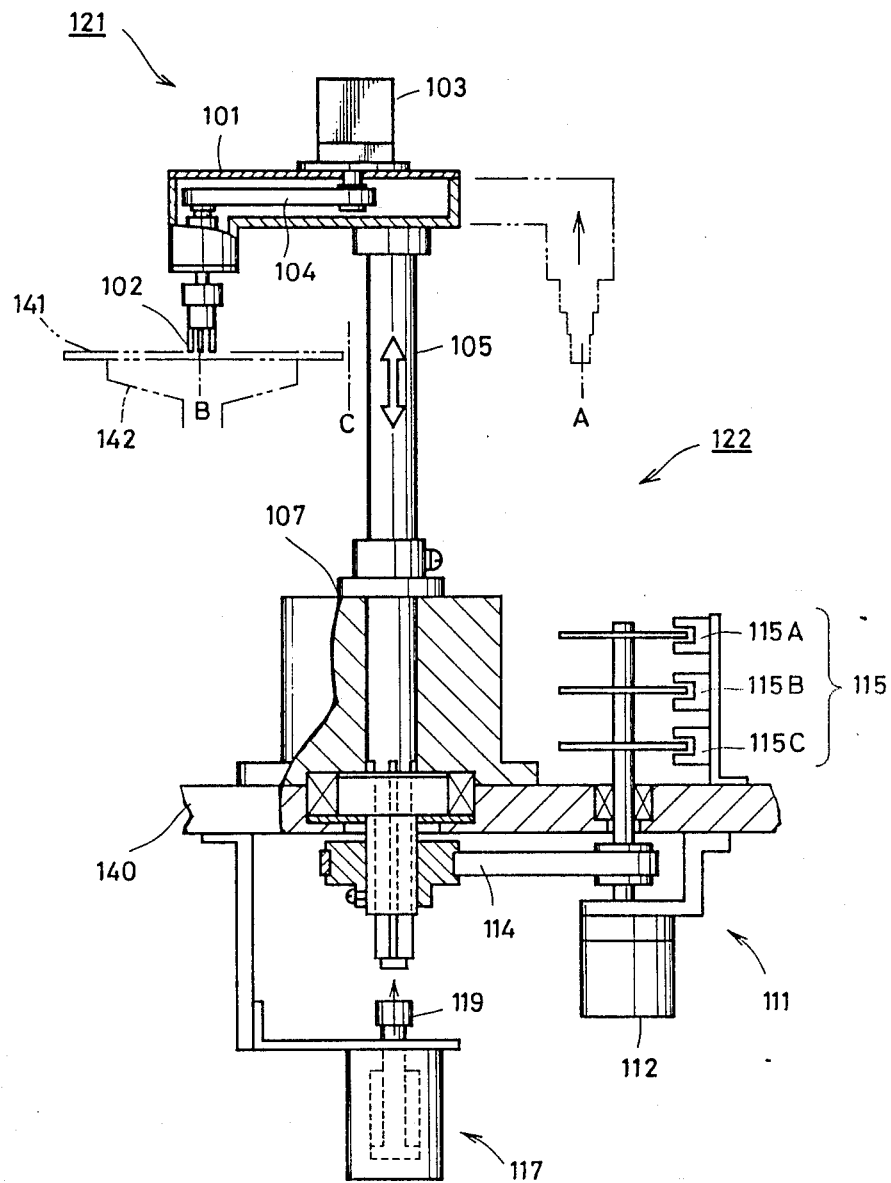
FIG. 1 is a side view showing a conventional cleaning apparatus.
Figure 2:
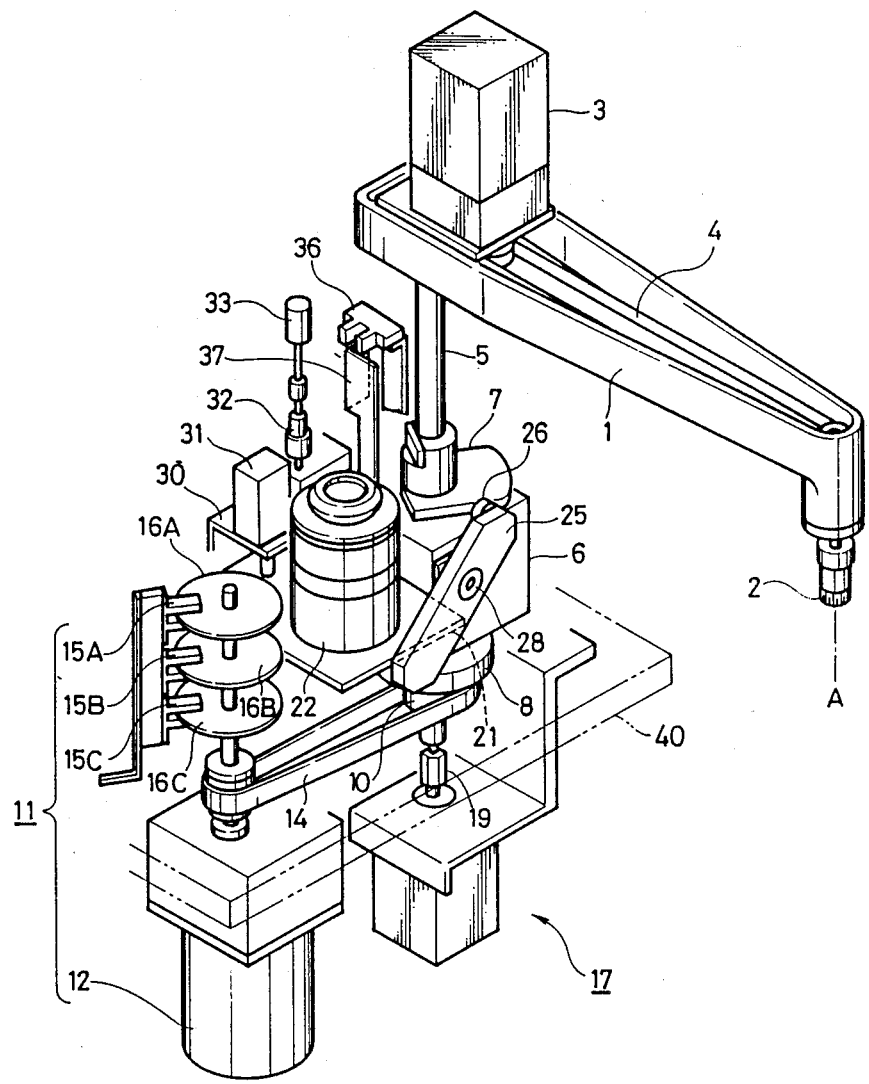
FIG. 2 is a perspective view showing a cleaning apparatus in accordance with the present invention.
Figure 3:
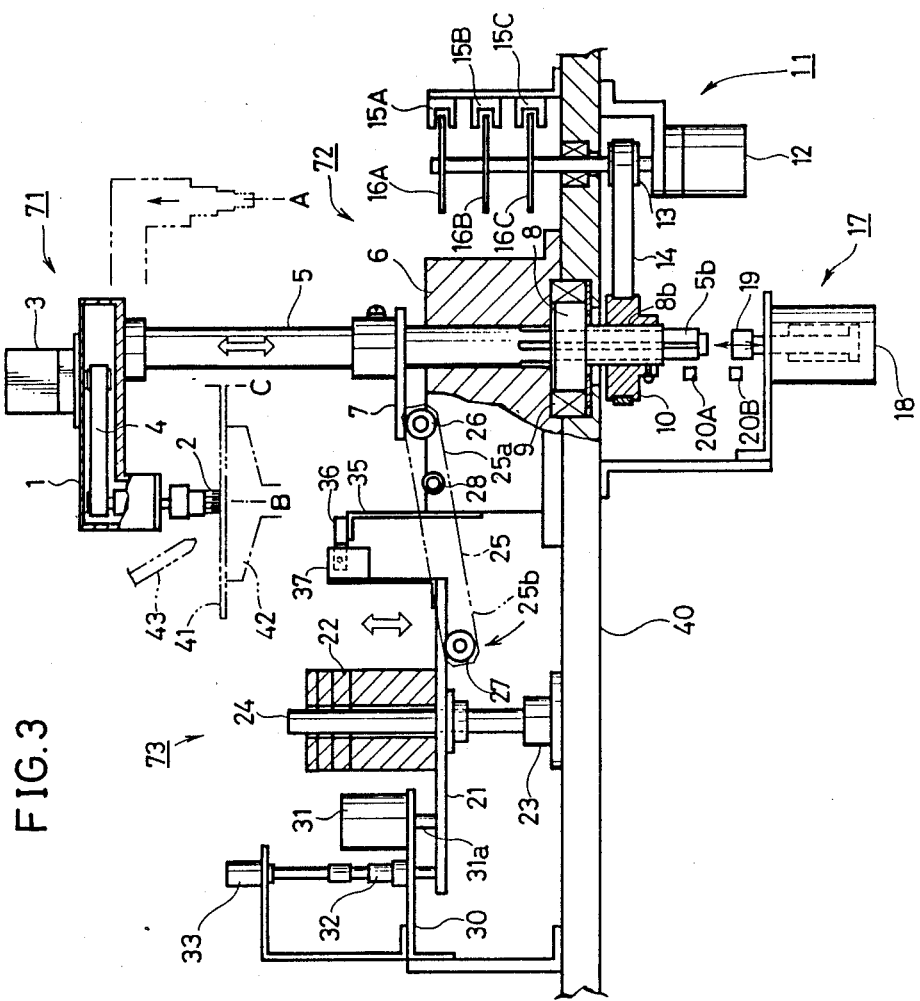
FIG. 3 is a side view showing the cleaning apparatus in accordance with the present invention.

Referring to FIGS. 2 and 3, a substrate cleaning apparatus in accordance with the present invention comprises a cleaning portion 71 for cleaning substrates, a supporting portion 72 for supporting the cleaning portion 71 and a buffer apparatus 73 for preventing the cleaning portion 71 from being brought into contact with the substrate with a force larger than a prescribed force. The cleaning portion 71 comprises a rotary cleaning brush 2 for cleaning the substrate 41, a swing arm 1 for rotatably holding the rotary cleaning brush 2, and a driving motor 3 for rotating the cleaning brush provided on the swing arm 1 for driving the rotary cleaning brush 2 through a transmission belt 4. The support portion 72 comprises an arm support 5 for swingably holding the cleaning portion 71, a rotary driving apparatus 11 for rotating the arm support 5, an elevating apparatus 17 provided below the arm support 5 for elevating the arm support 5, a load receiving plate fixed on the arm support 5 for receiving the load of the swing arm 1 and the arm support 5, and a swing position detecting apparatus 15 for detecting the swing or radial position of the swing arm 1. The rotary driving apparatus 11 controls the position of swing of the swing arm 1 by rotating the arm support 5. One end of the swing arm is fixed on an upper end portion of the arm support 5. A rotary cleaning brush 2 is fixed on the other end of the swing arm 1. When the arm support 5 is rotated by the rotary driving apparatus 11, the swing arm 1 is swung radially horizontally about the arm support 5. When the arm support 5 is elevated and lowered by the elevating apparatus 17, the swing arm 1 is elevated and lowered accordingly. The arm support 5 is supported by a support boss 6 fixed on a base 40 which allows rotation and elevation of the arm support 5. The load receiving plate 7 is fixed above the boss 6 of the arm support 5. A spline 5b is formed at a lower portion of the arm support 5, the spline 5b being coupled to a spline sleeve 8 to which a driven pulley 10 is fixed. The spline sleeve 8 is rotatably fixed on the base 40 through a bearing 9. A driven pulley 10 is fixed on a pulley fixing axis 8b of the spline sleeve 8. The rotary driving apparatus 11 comprises a driving motor 12 for driving the driven pulley 10 through a driving pulley 13 and a transmission belt 14, and a rotating position detecting apparatus 15. The rotating position detecting apparatus comprises sensors 15A, 15B and 15C for controlling positions and disks 16A, 16B and 16C provided with slits at prescribed positions. The three rotating position detecting sensors 15A, 15B and 15C respectively detect that the position of the rotary cleaning brush is at the standby position A, the central position B of the substrate 41 and the peripheral position C of the substrate 41 shown in FIG. 3.

The elevating apparatus 17 comprises an air cylinder 18 fixed on the lower side of the base 40 through a bracket, an output rod 19 of the air cylinder 18 pressed to the lower end (spline axis 5b) of the arm support 5 for raising and lowering the arm support 5 and sensors 20A and 20B for detecting the elevated and lowered position of the output rod 19.

The buffer apparatus 73 is coupled to the load receiving plate 7 to ensure that the plate 7, and with it the arm support 25 and the brush 2, move in the downward direction at a relatively slow speed to thereby ensure that the force with which the brush 2 contacts the substrates 41 is low. To this end, the buffer apparatus contacts the plate 7 from underneath with a prescribed upward force so as to lower the swing arm 1 at a reduced velocity. The buffer apparatus 73 comprises a table 21 for supporting weights 22 which, via lever 25, provide the prescribed force, the lever 25 which is pivotally coupled to a supporting boss 6 at pivot point 28 with opposite end portions thereof, being coupled to the load receiving plate 6 and the table 21; a decelerating cylinder 31 fixed to the base 40 by means of a fitting 30 for reducing the velocity of elevation of the table 21, and a spot assembly 32 provided on the fitting 30 for finely adjusting the uppermost position of the table 21. The table 21 can be elevated and lowered along an elevation guide bar 24. The lever 25 is provided with rollers 26 and 27 on the opposing end portions thereof, with the roller 26 placed on the underside of the load receiving plate 7 and the roller 27 placed on the underside of the table 21.

The length of respective portions of the lever 25 (relative to pivot point 28 and rollers 26, 27) and the like are selected such that at least the resultant force moment of the sum of the load on the swing arm and the load on the arm support 5 is larger than the moment resulting from the weight 22. For this purpose, the weight 22 placed on the table 21 comprises a plurality of weights 22 so as to enable the adjustment of the weight.

Meanwhile, the decelerating cylinder 31 comprises an orifice (not shown), and the velocity at which the rotary cleaning brush is lowered through the lever 25 is reduced to a desired velocity by adjusting the bore diameter of the orifice. A micrometer 33 is provided above the fitting 30.

Figure 5:
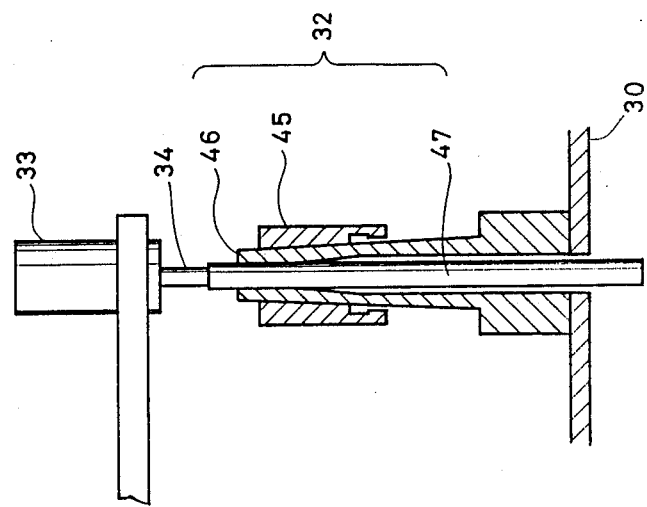
FIG. 5 shows details of a stop of the cleaning apparatus in accordance with the present invention.

FIG. 5 shows the details of the micrometer 33 and the stop assembly 32. Referring to FIG. 5, the stop assembly 32 comprises a collet chuck 46 movable along a cylindrical stop member 47 and a lock 45 for locking the stop member 47 to a desired vertical position relative to the collet chuck 46 and therefore relative to the fitting 30 and base 40. As will be described below, the lower most position of cleaning brush 2 is determined by the position of the lower end of stop member 47 and therefor is adjusted by adjusting the micrometer 33. When the position of the lower end of the stop member 47 is to be changed by changing the position of a lower end of a spindle 34 of the micrometer 33, the lock 45 is released and the contact between the collet chuck 46 and the stop member 47 is released. Thereafter, the spindle 34 is set to a desired length, the stop member 47 is set in contact with the end portion thereof and the lock 45 is again fastened. By adjusting the position of the lower end of the spindle 34 of the micrometer 33, the position of the lower end of the rotary cleaning brush 2 can be arbitrarily set by means of the stop assembly 32. Consequently, the shock can be eliminated when the rotary cleaning brush 2 is brought into contact with the substrate 41.

A brush rotation start sensor 36 is provided on the support boss 6 of the arm support 5 by means of a supporter 35 (FIG. 3). A detecting plate 37 is provided on the table 21. When the table 21 is elevated to a prescribed height and the sensor 36 detects the presence of the detecting plate 37, the rotary cleaning brush 2 starts rotation. Namely, the rotary cleaning brush 2 is rotated when the rotary cleaning brush 2 reaches a prescribed height. A spin chuck 42 for placing a substrate 41 to be cleaned is provided near a central position of the substrate (position B in FIG. 3) below the rotary cleaning brush 2, and a nozzle 43 for supplying cleaning liquid such as pure water is provided above the spin chuck 42.

The cleaning brush 2 comprises a sponge, a plumous brush and the like, and an appropriate cleaning brush is selected in accordance with the step of cleaning. The rotary cleaning brush is not necessarily employed.

Figure 4A:
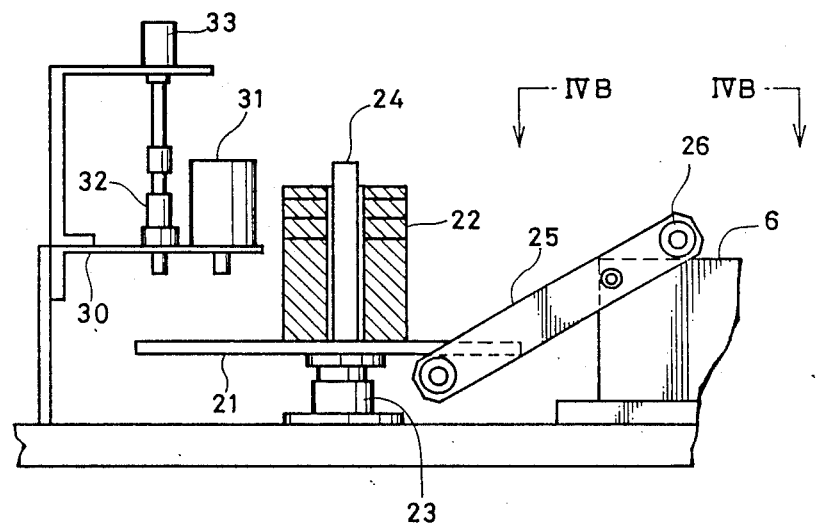
FIG. 4A is a side view of a main portion showing the cleaning apparatus in accordance with the present invention in a resting period.
Figure 4B:
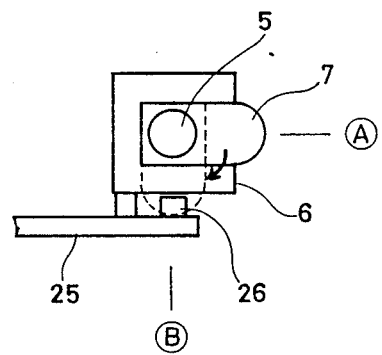
FIG. 4B shows a portion of the apparatus viewed in the direction of the arrows IVB—IVB of FIG. 4A.
Figure 6:
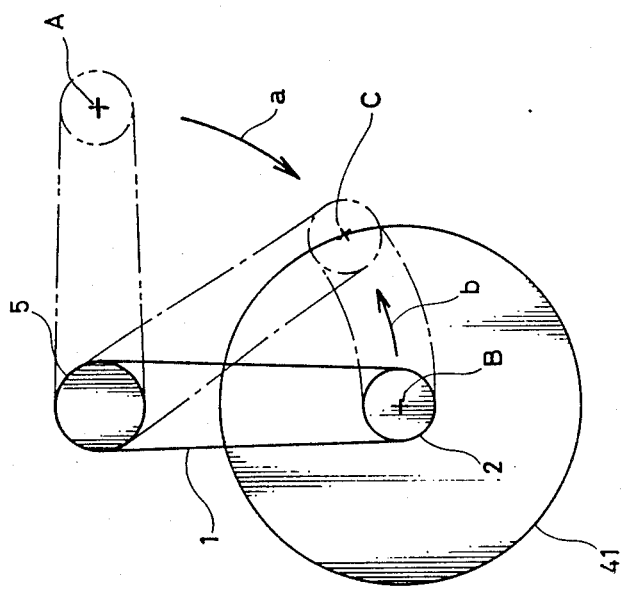
FIG. 6 is a plan view showing a motion of a swing bar.

FIG. 6 is a plan view showing a motion of a swing bar. The operation of the cleaning apparatus in accordance with the present invention will be described briefly with reference to FIG. 6. Before the start of the cleaning operation, the swing arm 1 is at the standby position A. At this position A, the load receiving plate 7 is located on the support boss 6 as shown in FIGS. 4A and 4B. The roller 26 of the lever 25 on the side of the support boss 6 is positioned above the support boss 6. The table 21 is located on the fixing 23.

When the substrate 41 is to be cleaned, the output rod 19 of the air cylinder 18 raises the arm support 5 (with the brush 2 at the standby position A), and the substrate 41 is rotated by the spin chuck 42. Thereafter, the driving motor 12 rotates the arm support 5 about its axis in the direction shown by the arrow a. Consequently, the rotary cleaning brush 2 is moved to the central position B of the substrate 41. The output rod 19 of the air cylinder 18 is then pulled down (while the brush 2 is at the position B), thereby lowering the arm support 5. As the brush 2 is rotated about the axis of arm supports from position A to position B, the load receiving plate 7 is rotated about the axis of the arm support 5 in the direction of the arrow in FIG. 4B, and the bottom edge thereof is placed on the roller 26 as shown in FIGS. 3 and 4B. When the arm support 5 is lowered below a prescribed position, the brush rotation start sensor 36 operates and the rotary cleaning brush 2 is rotated.

Meanwhile, the table 21 is placed on the roller 27 on the other side of the lever 25, and the table is elevated as the arm support 5 is lowered by means of the lever 25. At this time, the weights 22 on the table 21 and the output rod 31a of the decelerating cylinder 31 reduce the velocity of elevation of the table 21 and thereby reduce the velocity at which brush 2 moves into contact with substrate 41. Especially, since the decelerating cylinder 31 comprises an orifice as described above, the shock is absorbed when the table 21 is brought into contact with the bottom of stop member 47. Therefore, the velocity at which the load receiving plate 7 is lowered, is further reduced, and the load receiving plate 7 is stopped without vibration. Therefore, the rotary cleaning brush 2 is brought into contact with that substrate 41 with a moderate force. Simultaneously with or after contact, the table 21 is brought into contact with the lower end of the spindle of the micrometer 33 fixed by the stop member 32 and is stopped.

Thereafter, the driving motor 12 of the swing arm 1 is rotated reversely. The rotary cleaning brush 2 which is being rotated, is moved from the position near the central position B to the peripheral position C of the substrate 41 as shown in FIGS. 3 and 6 by an arrow b. At the same time, a cleaning liquid is applied from the nozzle 43, and the surface of the substrate 41 is cleaned. The load receiving plate 7 is kept on the roller 26 while the rotary cleaning brush 2 is moved from the position B to the position C. If necessary, the series of operation including the steps of elevating the rotary cleaning brush 2, moving the same to the central position B of the substrate, bringing the rotary cleaning brush 2 in contact with the substrate and moving the rotary cleaning brush to the peripheral position C of the substrate is repeated a required number of times. This is done, for example when the substrate 41 is not very clean.

In the foregoing, description was made of a case in which the cleaning brush 2 is brought into contact with the substrate 41 to carry out cleaning. The present invention can be applied to a so called hydro-plane system in which the rotary cleaning brush 2 is spaced apart by a small distance from the substrate 41 by finely adjusting the spindle lengths of the micrometer 33.

As described above, according to the present invention, the substrate cleaning apparatus comprises a cleaning portion 71, a support portion 72 and a contact buffer apparatus 73. Therefore, the rotary cleaning brush is brought into contact with the substrate with moderate initial force. Consequently, a substrate cleaning apparatus can be provided which prevents damage on the surface of the substrate, which improves yield in cleaning substrates and satisfies more strict conditions of cleaning.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cleaning apparatus for cleaning an object, said apparatus comprising:
   means for supporting an object to be cleaned at a cleaning position;
   a cleaning brush;
   brush holding means for holding said cleaning brush and moving said brush toward said object to a position wherein said brush can clean said object, said brush holding means attempting to move said brush toward said object at a prescribed first velocity; and
   buffer means connected to said brush holding means for ensuring that said brush is brought into contact with said object with a force smaller than a prescribed force, said buffer means comprising decelerating means for changing the moving velocity of said brush holding means from said first velocity to a second slower velocity.

2. A cleaning apparatus according to claim 1, wherein said buffer apparatus comprises speed changing means for changing said second velocity.

3. A cleaning apparatus according to claim 2, further including
   cleaner position directing means for detecting when said brush is at a prescribed position;
   means for rotating said brush in response to a detection output signal from said cleaner position detecting means; and
   said prescribed position is a position where said brush and said object are about to be placed in contact with each other.

4. A cleaning apparatus according to claim 1, wherein said prescribed force is small enough to prevent damage to said object when said brush is brought into contact with said object.

5. A cleaning apparatus according to claim 1, wherein said object is supported by said supporting means along an imaginary plane and said brush holding means moves said brush toward said object along a path substantially perpendicular to said imaginary plane.

6. A cleaning apparatus according to claim 5, wherein said brush holding means comprises:
   a shaft located at a position spaced from said object;
   means for moving said shaft up and down along an axis extending in a direction perpendicular to said imaginary plane; and
   a longitudinal member coupled to said shaft and extending radially therefrom, said brush being coupled to said longitudinal member at a position radially spaced from said axis.

7. A cleaning apparatus according to claim 6, further including means for rotating said longitudinal member about said axis so as to rotate said brush about said axis.

8. A cleaning apparatus according to claim 7, wherein said rotating means rotates said longitudinal member between a first position and a second position which is different from said first position, said brush being located at the center of said object when said longitudinal member is located at said first position.

9. A cleaning apparatus according to claim 8, wherein said rotating means swings said longitudinal member between said first position and a third position closer to said first position than said second position when said brush is cleaning said object, said third position corresponding to the outer periphery of said object when said object is in said cleaning position.

10. A cleaning apparatus according to claim 8, wherein said buffer means comprises stopping means for limiting the downward movement of said brush along said path toward said imaginary plane so that said brush cannot move lower than a predetermined position.

11. A cleaning apparatus according to claim 10, wherein said buffer means comprises means for adjusting said predetermined position.

12. A cleaning apparatus according to claim 11, wherein said adjusting means comprises a micrometer.

13. A cleaning apparatus according to claim 6, wherein:
   the weight of said brush and said brush holding means combine to create a first load; and
   said decorating means comprises means for applying a second load, smaller than said first load, to said means in a direction opposite to a direction to which said first load is applied.

14. A cleaning apparatus according to claim 13, wherein said decelerating means comprises:
   a weighted platform;
   a lever pivotal around a fulcrum, said lever having first and second arms extending from said fulcrum; and
   said second arm being coupled to said weighted platform, said first arm coupled to said shaft.

15. A cleaning apparatus according to claim 14, wherein said weighted platform defines a third load.

16. A cleaning apparatus according to claim 15, wherein:
   said first arm of said lever has a first length and said second arm has a second length;

a product of said first arm length and said first load defining a first moment;

a product of said second arm length and said third load defining a second moment, said first moment corresponding to said first load and said second moment corresponding to said second load.

17. A cleaning apparatus according to claim 16, wherein said weighted platform comprises:

a support platform; and weights which are removably located on said platform, said third load being determined by the number of said weights located on said platform.

18. A cleaning apparatus according to claim 17, wherein said second velocity is varied by changing the number of said weights placed on said support platform.

19. A cleaning apparatus according to claim 1, further including means for rotating said brush while it is in contact with said object.

20. A cleaning apparatus according to claim 19, further including means for applying a cleaning liquid between said object and said brush.

21. A cleaning apparatus according to claim 20, wherein said support means rotates said object while said object is at said cleaning position.

* * * * *